United States Patent
Jeung et al.

(10) Patent No.: US 7,741,890 B2
(45) Date of Patent: Jun. 22, 2010

(54) METHOD AND APPARATUS FOR GENERATING MULTI-PHASE SIGNALS

(75) Inventors: Jin-hyuk Jeung, Seoul (KR); Kwang-ho Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/873,752

(22) Filed: Oct. 17, 2007

(65) Prior Publication Data

US 2008/0157833 A1 Jul. 3, 2008

(30) Foreign Application Priority Data

Jan. 3, 2007 (KR) .................... 10-2007-0000683

(51) Int. Cl.
*H03L 7/06* (2006.01)
(52) U.S. Cl. .............. 327/158; 327/293; 327/295; 327/144; 327/163
(58) Field of Classification Search .............. 327/291, 327/293, 295, 141, 144–163; 375/373, 376; 331/15–17, 1 A
See application file for complete search history.

(56) References Cited

U.S. PATENT DOCUMENTS

| | | | | |
|---|---|---|---|---|
| 6,222,406 | B1 * | 4/2001 | Noda et al. | 327/269 |
| 6,657,500 | B1 * | 12/2003 | Chen | 331/17 |
| 2001/0050581 | A1 * | 12/2001 | Saeki | 327/158 |
| 2003/0122604 | A1 * | 7/2003 | Saeki | 327/291 |

FOREIGN PATENT DOCUMENTS

JP 2001-007686 1/2001

* cited by examiner

*Primary Examiner*—Lincoln Donovan
*Assistant Examiner*—Brandon S Cole
(74) *Attorney, Agent, or Firm*—F. Chau & Associates, LLC

(57) ABSTRACT

A method and apparatus for generating multi-phase clock signals. The multi-phase generating method includes: generating L reference clock signal groups having predetermined phase delay intervals from an external clock signal, wherein each reference clock signal group includes M sub reference clock signals; averaging phases of sub reference clock signals for each reference clock signal group, and generating L main reference clock signals from the L×M sub reference clock signals; and sequentially delaying the L main reference clock signals, and generating the N multi-phase clock signals having the different phases. Because a plurality of clock signals having equal phase delay intervals between each other are generated regardless of the frequency of a received clock signal, the yield of Delay Locked Loop (DLL) circuits is improved using the multi-phase generating apparatus.

13 Claims, 7 Drawing Sheets

FIG. 3 (PRIOR ART)

| REFERENCE PHASE GENERATOR | | DELAY CELL MATRIX | | | | | | |
|---|---|---|---|---|---|---|---|---|
| FIRST REFERENCE CLOCK | 9° | 54° | 99° | 144° | 189° | 234° | 279° | 324° | 9° |
| SECOND REFERENCE CLOCK | 18° | 63° | 108° | 153° | 198° | 243° | 288° | 333° | 18° |
| THIRD REFERENCE CLOCK | 27° | 72° | 117° | 162° | 207° | 252° | 297° | 342° | 27° |
| FORTH REFERENCE CLOCK | 36° | 81° | 126° | 171° | 216° | 261° | 306° | 315° | 36° |
| FIFTH REFERENCE CLOCK | 45° | 90° | 135° | 180° | 225° | 270° | 315° | 360° | 45° |

HIGH FREQUENCY   LOW FREQUENCY

METHOD AND APPARATUS FOR GENERATING MULTI-PHASE SIGNALS

CROSS-REFERENCE TO RELATED PATENT APPLICATION

This application claims the benefit of Korean Patent Application No. 10-2007-0000683, filed on Jan. 3, 2007, in the Korean Intellectual Property Office, the disclosure of which is incorporated herein in its entirety by reference.

BACKGROUND OF THE INVENTION

1. Technical Field

The present disclosure relates to a Delay Locked Loop (DLL) circuit and, more particularly, to a multi-phase generating method and apparatus for generating a plurality of clock signals having equal phase differences between each other, regardless of the frequency of an external clock signal.

2. Discussion of Related Art

As the bandwidth of systems increases, Phase Locked Loop (PLL) circuits and Delay Locked Loop (DLL) circuits are used more and more. DLL circuits are especially widely used due to their excellent stability and favorable jitter characteristics.

FIG. 1 is a block diagram of a conventional DLL circuit 100.

Referring to FIG. 1, the conventional DLL circuit 100 includes a buffer 110, a delay cell block 120, a multiplexer 130, a phase detector 140, a controller 150, and an interpolator 160.

The delay cell block 120 includes N delay cells $D_1$ through $D_n$. The first delay cell 121 delays the phase of an external clock signal ext_CLK received through the buffer 110 by a predetermined delay time, and generates a first delayed clock signal CLK1. The second delay cell 122 delays the phase of the first delayed clock signal CLK1 by a predetermined delay time and generates a second delayed clock signal CLK2. The third delay cell 123 delays the phase of clock signal CLK2 by a predetermined delay and generates a third delayed clock signal CLK3. Likewise, the N-th delay cell 12N delays the phase of an (N-1)-th delayed clock signal CLKN-1 by a predetermined delay time, and generates an N-th delayed clock signal CLKN.

The multiplexer 130 selects two delayed clock signals from among the plurality of delayed clock signals CLK1 through CLKN generated by the delay cell block 120, in response to a control signal C1 received from the controller 150, and outputs the selected delayed clock signals to the interpolator 150. The multiplexer 130 includes two multiplexer units that respectively output different delayed clock signals to the interpolator 150.

The phase detector 140 compares the phase of the external clock signal ext_CLK with the phase of the delayed clock signal received from the multiplexer 130 and outputs an UP signal or a DOWN signal to the controller 150, according to the result of the comparison. That is, the phase of an external clock signal ext_CLK is compared with the phase of a delayed clock signal from the delay cell block 120 at the output of the multiplexer 130, and a signal corresponding to the difference between the phases is output.

The controller 150 outputs the first control signal C1 for causing the multiplexer 130 to select delayed clock signals, according to the UP or DOWN signal received from the phase detector 140, and a second control signal C2 for controlling the interpolator 160. That is, the controller 150 outputs control signals C1 and C2 to select desired delay cells from among the delay cells 121 through 12N, thereby performing a series of processes for frequency locking.

The interpolator 160 performs interpolation on the two delayed clock signals received from the multiplexer 130, and generates an internal clock signal int_CLK that is suitable for use in a system that includes the DLL. That is, by performing interpolation on the two delay clock signals having different delay times, the interpolator 160 performs a frequency locking process with the correct phase.

When the system operates at a high frequency, because electrical characteristics required to operate the system normally are loose, jitter increases if the unit delay time of each delay cell included in the delay cell block 120 is too long. On the other hand, when the system operates at a low operating frequency, although electrical characteristics required to operate the system normally are comparatively loose, frequency locking is difficult if the total delay time of the delay cells is too short. Accordingly, a multi-phase generating apparatus that can be applied to a wide frequency range is needed.

FIG. 2 is a block diagram of a conventional multi-phase generating apparatus 200.

Referring to FIG. 2, the conventional multi-phase generating apparatus 200 includes a reference phase generator 210 and a delay cell matrix 220. The reference phase generator 210 includes a plurality of main delay cells 211 through 215, and the delay cell matrix 220 includes a plurality of sub delay cells 211_1 through 225_N.

The first main delay cell 211 delays the phase of an external clock signal ext_CLK by a first predetermined time, and generates a first delayed clock signal CLK1. The second main delay cell 212 delays the phase of the external clock signal ext_CLK by a second predetermined time, and generates a second delayed clock signal. The third main delay cell 213 delays the phase of the external clock signal ext_CLK by a third predetermined time and generates a third delayed clock signal CLK3. The fourth main delay cell 214 delays the phase of the external clock signal ext_CLK by a fourth predetermined time and generates a fourth delayed clock signal CLK4. Likewise, a fifth main delay cell 215 delays the phase of the external clock signal ext_CLK by a fifth predetermined time, and generates a fifth delayed clock signal CLK5.

The respective delayed clock signals CLK1 through CLK5 generated by the reference phase generator 210 have equal phase differences between each other, and are reference clock signals for causing the delay cell matrix 220 to generate multi-phase clock signals. The respective clock signals CLK1 through CLK5 are input to the delay cell matrix 220 through different channels. The delay cell matrix 220 includes N stages.

Because the number of main delay cells included in the reference phase generator 210 can vary, the number of channels required for connecting the reference phase generator 210 with the delay cell matrix 220 can also increase or decrease. Accordingly, the number of multi-phase clock signals that will be generated by the delay cell block 200 can also change.

If the reference phase generator 210 generates the reference clock signals CLK1 through CLK5, the delay cell matrix 220 receives the reference clock signals CLK1 through CLK5 through the corresponding channels, and sequentially generates multi-phase clock signals through N stages. For example, if the delay cell matrix 220 includes 40 sub delay cells, the delay cell matrix 220 can generate 40 clock signals having phase differences of 90 (360/40) between each other.

Because the delay cell matrix 220 generates the multi-phase clock signals on the basis of the reference clock signals CLK1 through CLK5 received from the reference phase generator 210, the delay cell matrix 220 cannot generate multi-phase clock signals having equal phase intervals to each other if there are offsets generated in the phases of the reference clock signals CLK1 through CLK5.

FIG. 3 is a table illustrating the phases of the multi-phase clock signals output from the multi-phase generating apparatus 200 illustrated in FIG. 2. In FIG. 3, the phases of five reference clock signals and the phases of 40 multi-phase clock signals generated using the reference clock signals are illustrated.

Referring to FIGS. 2 and 3, the reference phase generator 210 generates five reference clock signals having respective delay phases of 9°, 18°, 27°, 36° and 45°, through the main delay cells 211 through 215. The delay cell matrix 220 generates eight multi-phase clock signals having different phases for each reference clock signal, through five delay lines.

Accordingly, if offsets exist in the phases of the reference clock signals generated by the reference phase generator 210, the delay cell matrix 220 will generate multi-phase clock signals that will reflect or amplify the offsets. This reduces the stability of a system requiring clock signals having equal phase intervals relative to each other.

FIG. 4 is a graph showing the non-linearity of a multi-phase clock signal, and FIG. 5 is an illustration for explaining a change in a reference clock signal with respect to a change in frequency.

Referring to FIG. 4, multi-phase clock signals having normal phase differences between each other are denoted by a solid line, and multi-phase clock signals having abnormal phase differences between each other are denoted by dotted lines. Since the multi-phase clock signals having the normal phase differences between each other have equal phase intervals between each other, the multi-phase clock signals have linearity. On the other hand, because the multi-phase clock signals having the abnormal phase differences between each other have unequal phase intervals between each other, the multi-phase clock signals are non-linear.

Referring to FIG. 5, the left part of FIG. 5 represents reference clock signals generated by the reference phase generator 210 when a high-frequency clock signal is received, and the right part of FIG. 5 represents reference clock signals generated by the reference phase generator 210 when a low-frequency clock signal is received.

If the linearity of phase delays is adjusted based on a high-frequency clock signal, non-linearity of phase delays occurs in a low-frequency clock signal. On the contrary, if the linearity of phase delays is adjusted based on a low-frequency clock signal, non-linearity of phase delays occurs in a high-frequency clock signal. That is, if the frequency of an external clock signal changes, the stability of the reference phase generator 210, shown in FIG. 2, cannot be ensured.

More specifically, in next-generation Digital Versatile Disk (DVD) and Blue-ray Disk (BD) systems, the importance of multi-phase clock signals is increasing. In the conventional technologies, however, because the possibility of phase offsets increases as the number of multi-phase signals increases, a problem can occur when data is read to or written from a storage medium such as optical discs.

SUMMARY OF THE INVENTION

Exemplary embodiments of the present invention provide a multi-phase generating method and apparatus for generating reference clock signals having equal phase differences between each other, regardless of the frequency of an external clock signal.

According to an exemplary embodiment of the present invention, there is provided a method of generating N multi-phase clock signals having different phases, from an external clock signal received from the outside, the method including: generating L reference clock signal groups having predetermined phase delay intervals from the external clock signal, wherein each reference clock signal group includes M sub reference clock signals; averaging phases of the sub reference clock signals for each reference clock signal group, and generating L main reference clock signals from the L×M sub reference clock signals; and sequentially delaying the L main reference clock signals, and generating the N multi-phase clock signals having the desired different phases.

In the generating of the L main reference clock signals, the phases of the sub reference clock signals for each reference clock signal group are averaged over at least two stages.

In the generating of the L main reference clock signals, the phases of the sub reference clock signals for each reference clock signal group are averaged through interpolation.

L is 4, 5, or 6, and M is equal to or greater than 3.

According to an exemplary embodiment of the present invention, there is provided a multi-phase clock signal generating apparatus for generating N clock signals having different phases from an external clock signal received from the outside, the apparatus including: a sub reference clock generator generating L reference clock signal groups having predetermined phase delay intervals from the clock signals, wherein each reference clock signal group includes M sub reference clock signals; a main reference clock generator averaging phases of sub reference clock signals for each reference clock signal group, and generating L main reference clock signals from the L×M sub reference clock signals; and a delay cell matrix sequentially delaying the L main reference clock signals, and generating the N multi-phase clock signals having the different phases.

The main reference clock generator includes at least two stages averaging the phases of sub reference clock signals for each reference clock signal group.

Each stage includes a plurality of averaging units, each averaging unit receiving at least two reference clock signals from the previous stage and generating a reference clock signal.

The final stage of the main reference clock generator includes L averaging units.

The delay cell matrix includes N sub delay cells generating the N multi-phase clock signals having the different phases.

The delay cell matrix includes L channels receiving the second reference clock signals.

BRIEF DESCRIPTION OF THE DRAWINGS

Exemplary embodiments of the present invention will be understood in more detail from the following descriptions taken in conjunction with the attached drawings, in which:

FIG. 3 is a table illustrating the phases of multi-phase clock signals output from the conventional multi-phase generating apparatus illustrated in FIG. 2;

DETAILED DESCRIPTION OF EXEMPLARY EMBODIMENTS

The above objects, characteristics, and advantages of exemplary embodiments of the present invention will be easily understood with reference to the appended drawings and the following descriptions, so that one of ordinary skill in the art can easily implement the exemplary embodiments of the present invention. Also, when the exemplary embodiments of the present invention are described, the detailed description of known techniques will be omitted if it would obscure the understanding of the exemplary embodiments of the prevent invention to include them. Exemplary embodiments of the present invention will now be described in detail with reference to the appended drawings.

Figure 1:
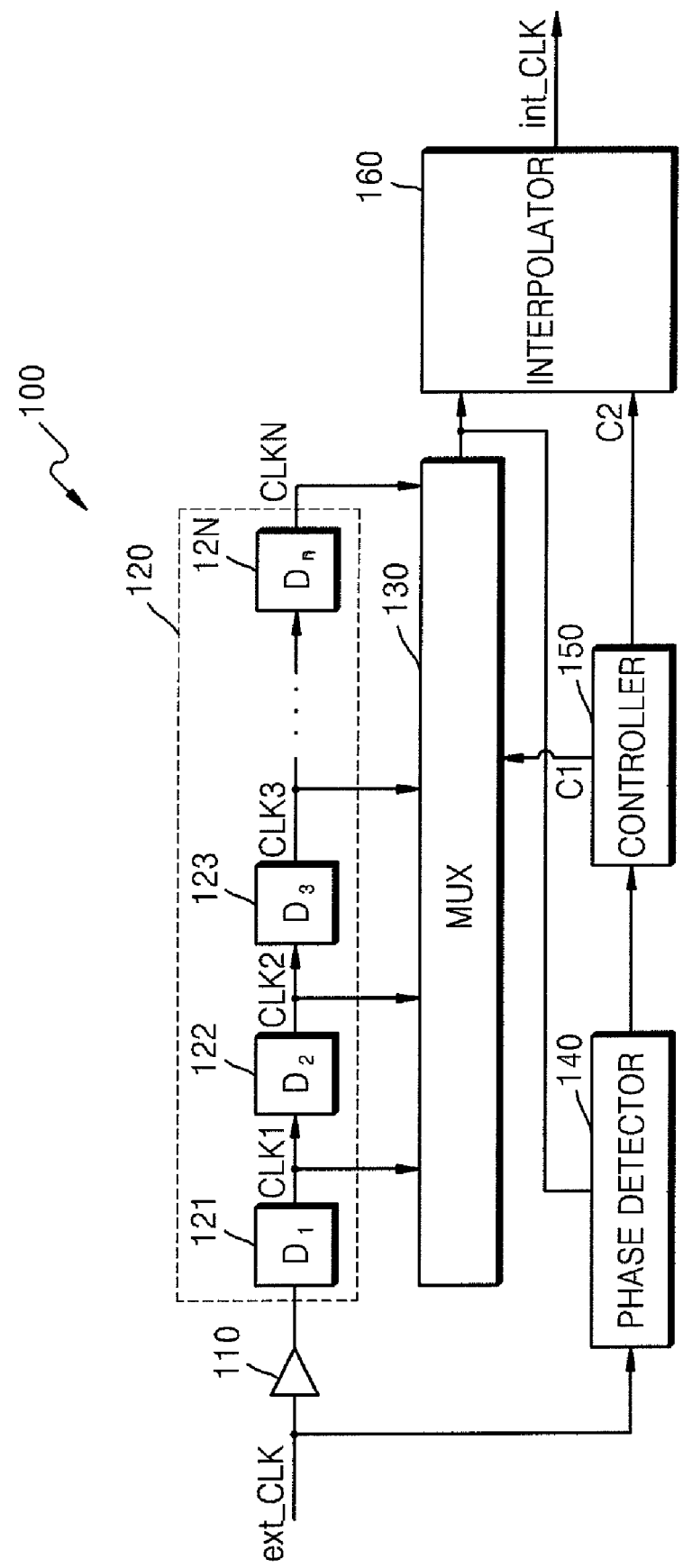
FIG. 1 is a block diagram of a convention Delay Locked Loop (DLL) circuit.
Figure 2:
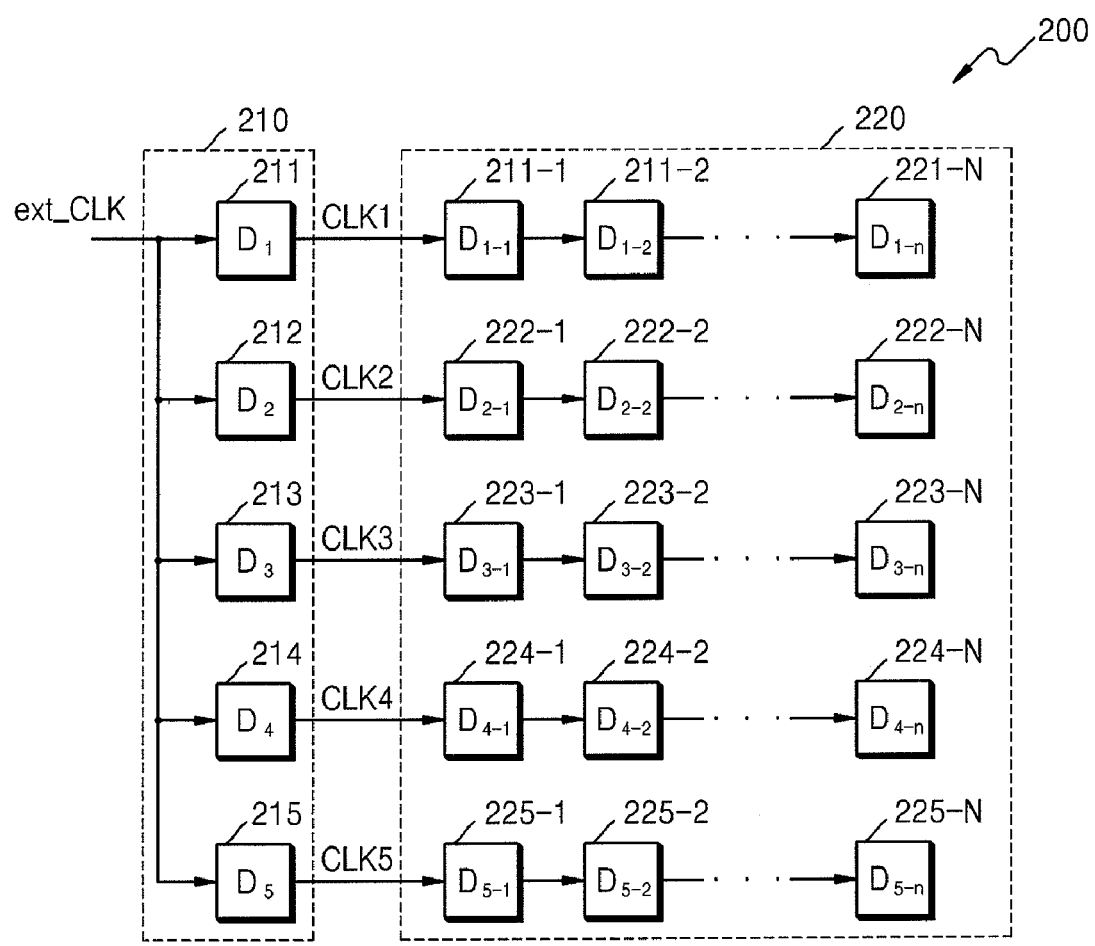
FIG. 2 is a block diagram of a conventional multi-phase generating apparatus.
Figure 4:
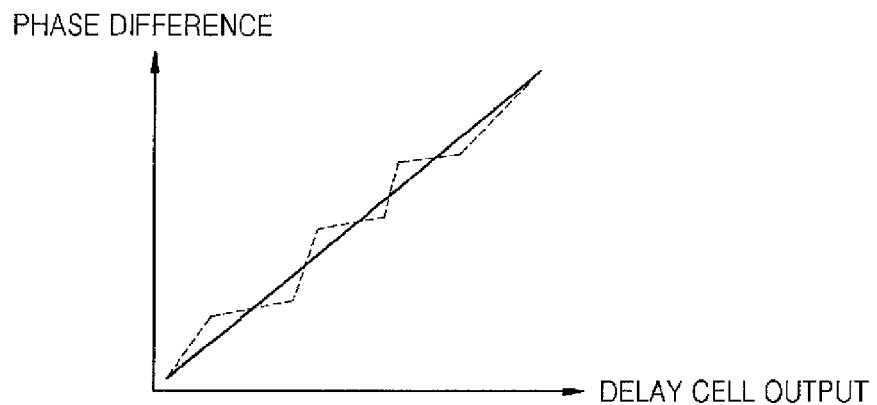
FIG. 4 is a graph showing the non-linearity of a multi-phase clock signal.
Figure 5:
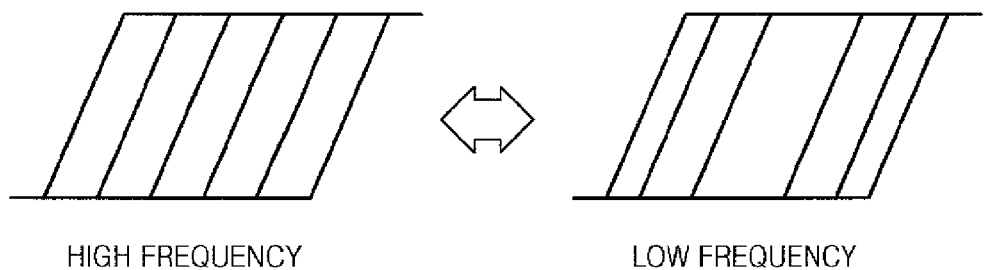
FIG. 5 is a view for explaining a change in a reference clock signal with respect to a change in frequency.
Figure 6:
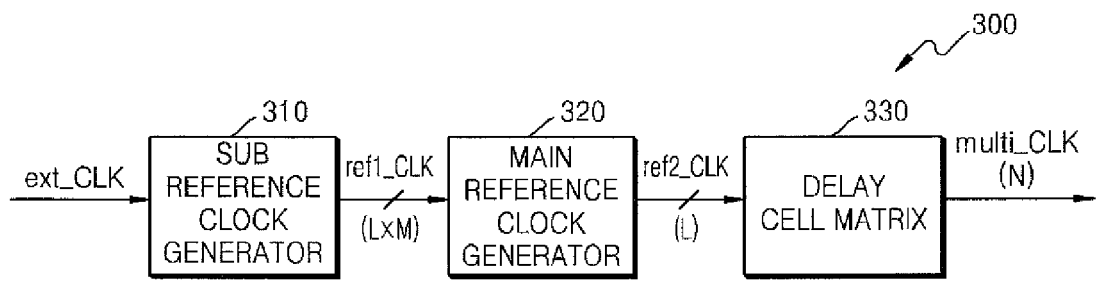
FIG. 6 is a block diagram of a multi-phase generating apparatus according to an exemplary embodiment of the present invention.

FIG. 6 is a block diagram of a multi-phase generating apparatus 300 according to an exemplary embodiment of the present invention.

The multi-phase generating apparatus 300 includes a sub reference clock generator 310, a main reference clock generator 320, and a delay cell matrix 330.

The sub reference clock generator 310 receives an external clock signal ext_CLK, and generates a plurality of reference clock signals ref1_CLK. The reference clock signals ref1_CLK are classified into L groups, wherein L is a natural number. Each group includes M sub reference clock signals, wherein M is a natural number. The M sub reference clock signals included in each group are used in generating a new main reference clock signal.

The M sub reference clock signals included in each group may have phase offsets. For example, when four clock signals have a nominal phase delay of 10° with respect to the external clock signal ext_CLK, the four clock signals can respectively have phase delays of 8°, 9°, 11°, and 12°. Accordingly, a process is needed to remove the phase offsets of the sub reference clock signals ref1_CLK.

The main reference clock generator 320 calculates an average of the phase offsets of the sub reference clock signals ref1_CLK included in each group received from the sub reference clock generator 310, corrects the phase offsets of the sub reference clock signals ref1_CLK according to the calculated average of the phase offsets, and generates main reference clock signals ref2_CLK. That is, the main reference clock generator 320 generates a new main reference clock signal ref2_CLK for each group.

In an exemplary embodiment of the present invention, L×M preliminary reference clock signals are generated for L reference clock signals, and the phase offsets of preliminary clock signals that will have the same phase, among the L×M preliminary reference clock signals, are averaged. That is, an exemplary embodiment of the present invention has a technical characteristic of generating a plurality of preliminary reference clock signals in order to generate reference clock signals having equal phase delay times relative to each other.

The delay cell matrix 330 receives the L reference clock signals ref2_CLK whose phase offsets are reduced, from the phase error correction unit 320, and generates N clock signals multi_CLK having multiple phases, wherein N is a natural number greater than L. Since the reference clock signals ref2_CLK output from the phase error correction unit 320 have very little phase offset, the N multi-clock signals multi_CLK having different phases that are generated by the delay cell matrix 330 will also have very little phase offset.

Figure 7:
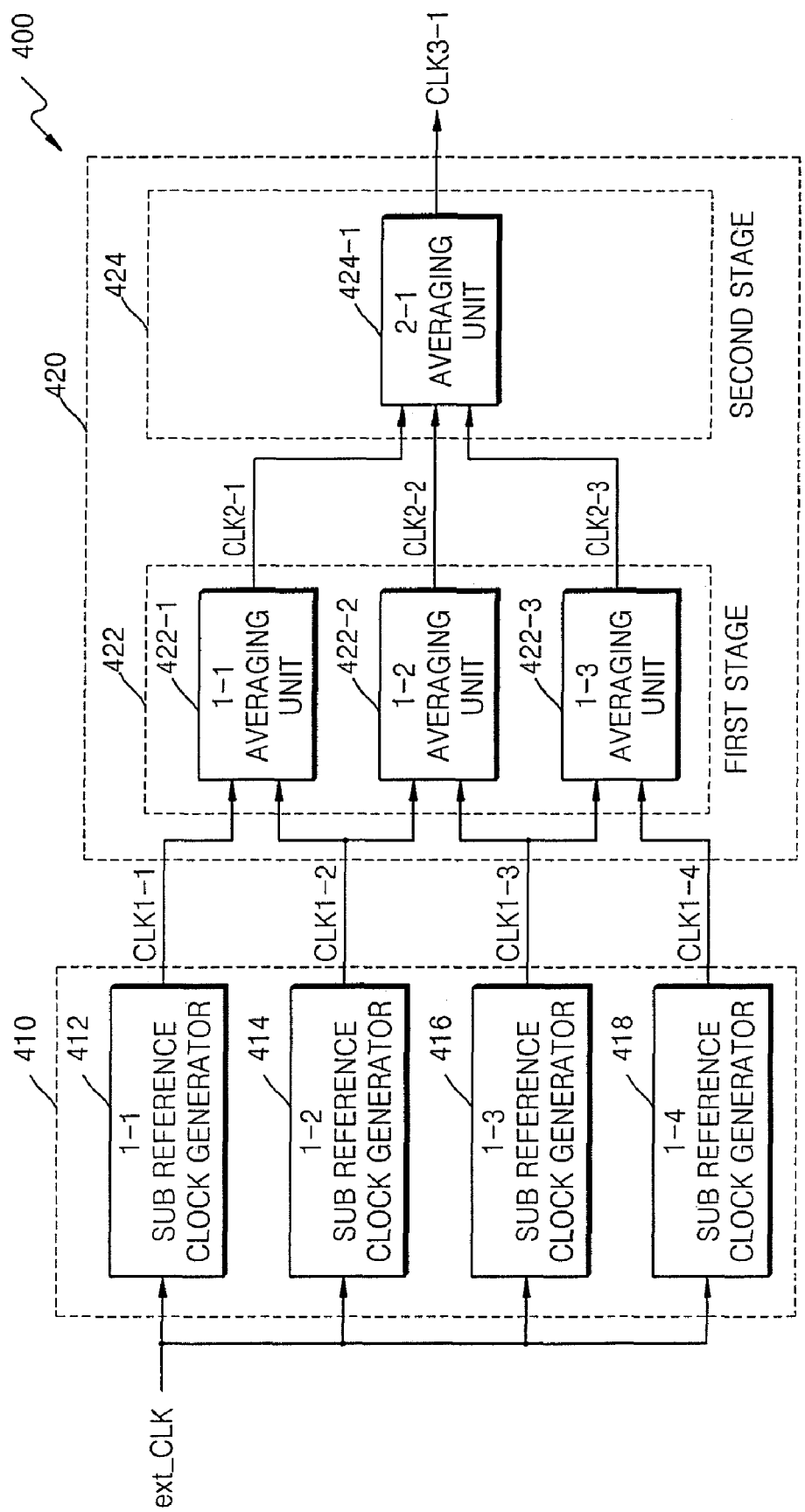
FIG. 7 is a more detailed block diagram of a multi-phase generating apparatus according to an exemplary embodiment of the present invention.

FIG. 7 is a more detailed block diagram of a multi-phase generating apparatus 400 according to an exemplary embodiment of the present invention. FIG. 7 shows a configuration for generating a main reference clock signal. Referring to FIG. 7, the multi-phase generating apparatus 400 includes a sub reference clock generator 410 and a main reference clock generator 420.

The sub reference clock generator 410 includes a plurality of sub reference clock generators 412, 414, 416, and 418. The respective sub reference clock generators 412, 414, 416, and 418 are designed to generate clock signals having equal phase delay times relative to each other. Phase offsets can be generated, however, according to the frequency characteristics of a received external clock signal ext_CLK.

The 1-1 sub reference clock generator 412 generates a reference clock signal whose phase is delayed by $\alpha + \Delta\alpha 1$, the 1-2 sub reference clock generator 414 generates a reference clock signal whose phase is delayed by $\alpha + \Delta\alpha 2$, the 1-3 sub reference clock generator 416 generates a reference clock signal whose phase is delayed by $\alpha + \Delta\alpha 3$, and the 1-4 sub reference clock generator 418 generates a reference clock signal whose phase is delayed by $\alpha + \Delta\alpha 4$. Here, $\Delta\alpha 1$, $\Delta\alpha 2$, $\Delta\alpha 3$, and $\Delta\alpha 4$ represent offsets with respect to a target delay phase $\alpha$.

The main reference clock generator 420 includes a first stage 422 and a second stage 424. The first stage 422, includes a plurality of averaging units 422-1, 422-2, and 422-3. The first stage 422 averages the phases of clock signals received from the sub reference clock generator 410, and the second stage 424 averages the phases of clock signals received from the first stage 422.

The 1-1 averaging unit 422-1 receives a first clock signal CLK1-1 and a second clock signal CLK1-2 from the 1-1 sub reference clock generator 412 and the 1-2 sub reference clock generator 414, respectively, and outputs a clock signal CLK2-1 having a delay phase of $\beta 1$ $(=\alpha+(\alpha 1+\alpha 2)/2)$. Likewise, the 1-2 averaging unit 422-2 outputs a clock signal CLK2-2 having a delay phase of $\beta 2$ $(=\alpha+(\alpha 2+\alpha 3)/2)$, and the 1-3 averaging unit 422-2 outputs a clock signal CLK2-3 having a delay phase of $\beta 3$ $(=\alpha+(\alpha 3+\alpha 4)/2)$.

The 2-1 averaging unit 424-1 receives the clock signal CLK2-1, the clock signal CLK2-2, and the clock signal CLK2-3 from the 1-1 averaging unit 422-1, the 1-2 averaging unit 422-2, respectively and the 1-3 averaging unit 422-3, and outputs a clock signal CLK3-1 having a delay phase of $\gamma$ $(=(\beta 1+\beta 3\ 2+\beta 3)/3)$. The clock signal CLK3-1 is output to a delay cell matrix (not shown) through a channel (not shown). The clock signal CLK3-1 is a main clock signal whose phase is delayed by $\gamma$. The delay phase $\gamma$ can be expressed as:

$$\gamma = \alpha + \frac{\Delta\alpha 1 + 2\Delta\alpha 2 + 2\Delta\alpha 3 + \Delta\alpha 4}{6} \quad (1)$$

In general, a phase offset △ is not a fixed value but can assume random values. Therefore, the phase offset △ can be positive (+) or negative (−), regardless of the frequency of the received clock signal. Accordingly, if the phases of clock signals are averaged, the phase offsets of the clock signals are reduced. For example, if it is assumed that α=10°, △1=2°, △α2=−3°, △α3=2°, and △α4=−3°, ∇=9.5 and accordingly the phase delay value ∇ approaches the target phase delay value α.

Exemplary embodiments of the present invention can significantly reduce phase offsets of reference clock signals used for generating multi-phase clock signals. As the phase offsets of reference clock signals are reduced, the phase offsets of multi-phase clock signals generated by the delay cell matrix are accordingly reduced, thereby maintaining the linearity of the phase intervals.

Although FIG. 7 illustrates a construction of an exemplary embodiment for generating a main reference clock signal, and a construction for generating a plurality of main reference clock signals whose phase offsets are reduced can be easily induced using the construction illustrated in FIG. 7. The phase offsets can be further reduced by increasing the number of stages included in the main reference clock generator 420.

Figure 8:
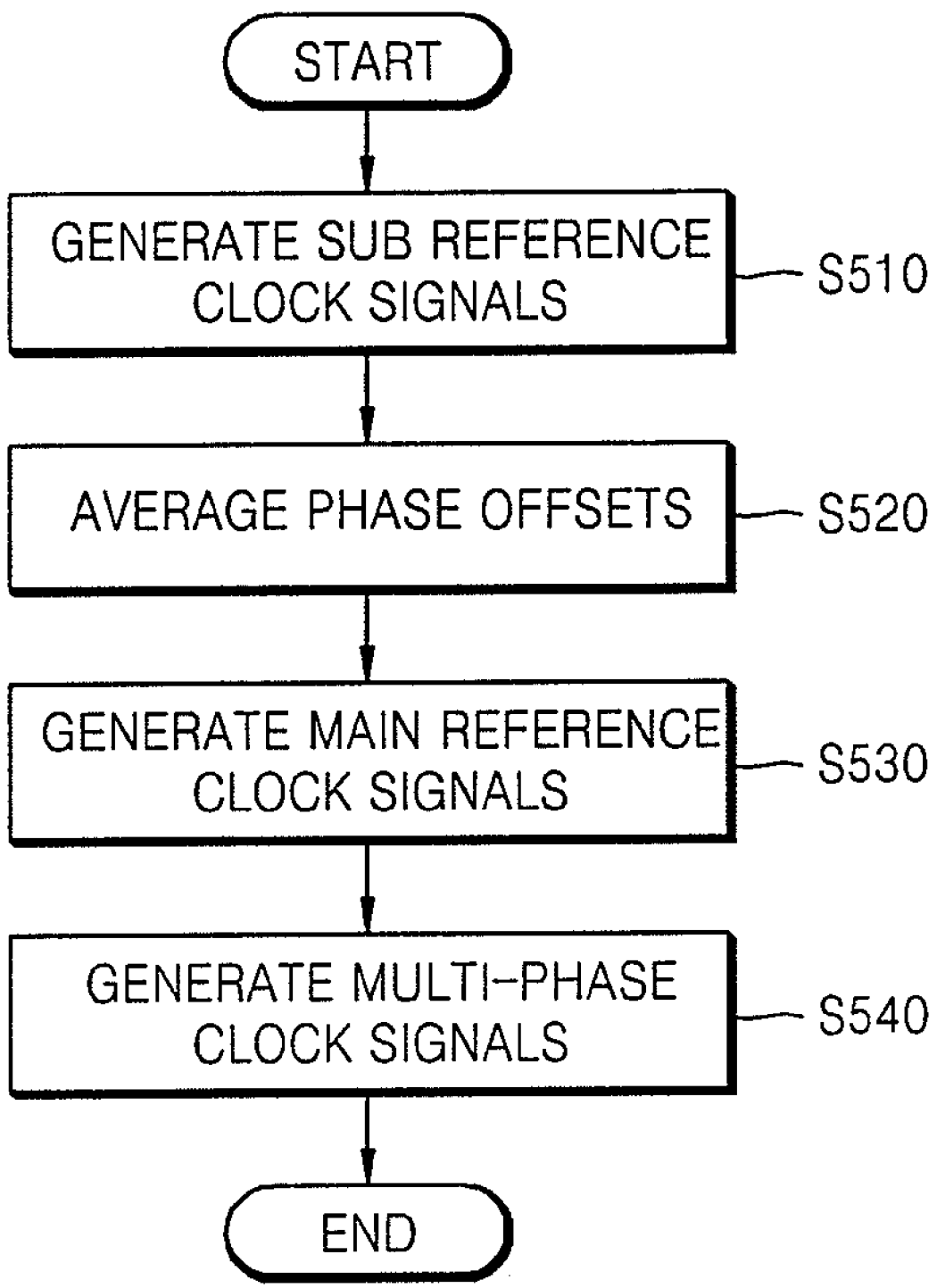
FIG. 8 is a flowchart of a multi-phase generating method according to an exemplary embodiment of the present invention.

FIG. 8 is a flowchart of a multi-phase signal generating method according to an exemplary embodiment of the present invention.

L reference clock signal groups having predetermined phase delay intervals are generated in response to an external clock signal received from the outside, wherein each reference clock signal group consists of M sub reference clock signals (operation S510). In this exemplary embodiment, L may be 4, 5, or 6, and M may be equal to or greater than 3.

Then, the phase offsets of M sub reference clock signals in each group are averaged (operation S520). The averaging process is performed independently for each group. The averaging process may be performed through interpolation.

Successively, L main reference clock signals are generated from the L×M sub reference clock signals through the averaging process (operation S530). A main reference clock signal is generated for each group. In order to generate the L main reference clock signals, at least two stages are provided.

Then, by sequentially delaying the L main reference clock signals, N multi-phase clock signals having different phases are generated (operation S540).

Therefore, since the phase offsets of the main reference clock signals are reduced, the phase offsets of the N multi-phase clock signals are accordingly reduced.

Figure 9A:
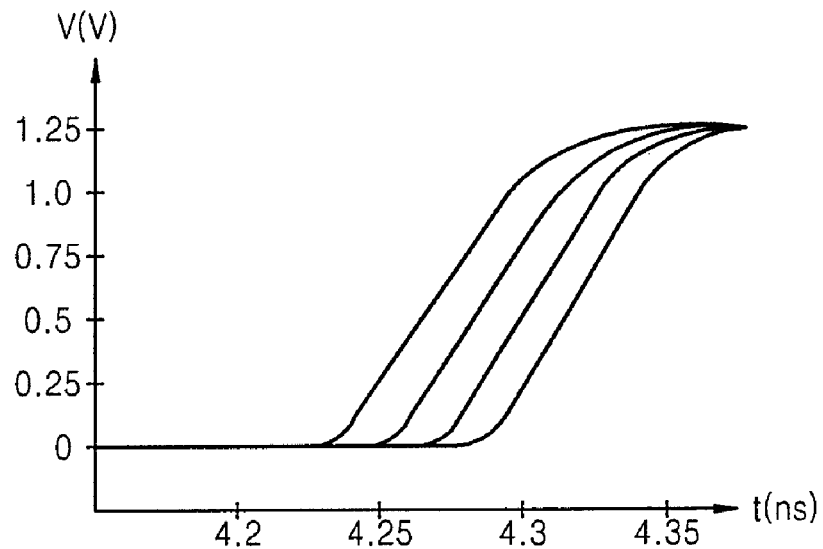
FIG. 9A is a graph showing the results of the conventional technique.
Figure 9B:
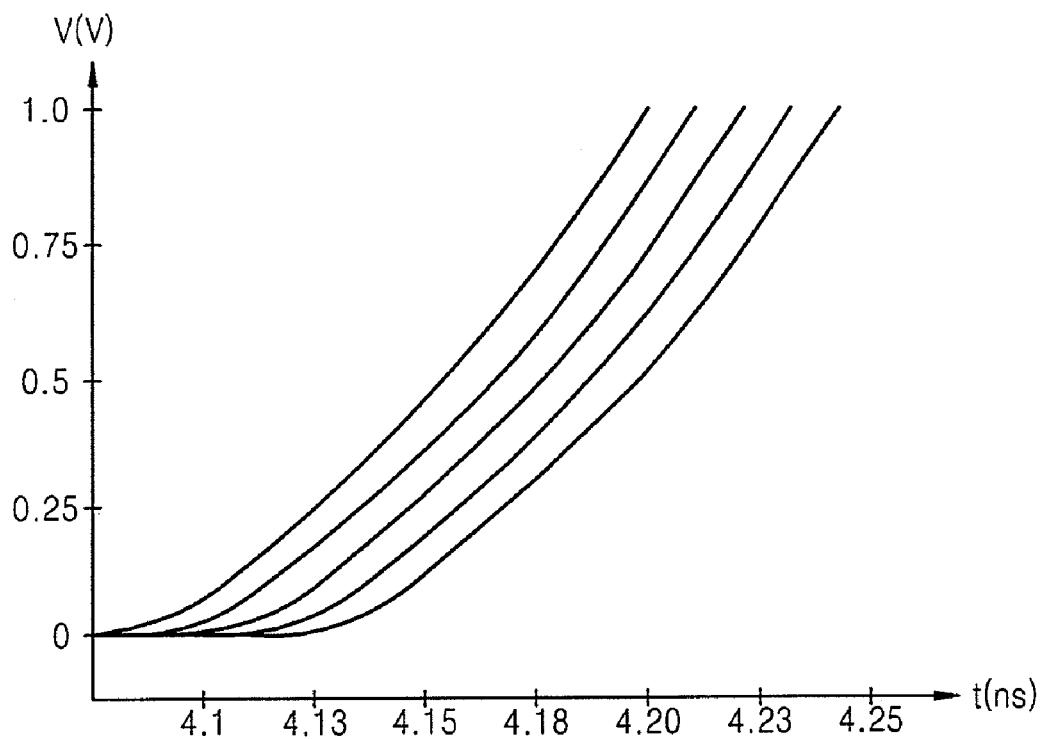
FIG. 9B is a graph showing the results of the exemplary embodiment of the present invention.

FIG. 9A is a graph showing the results obtained by using the conventional technique, and FIG. 9B is a graph showing the results obtained by using an exemplary embodiment of the present invention.

Referring to FIG. 9A, reference clock signals have non-linearity, which in turn increases the non-linearity of multi-phase clock signals. Referring to FIG. 9B, however, the non-linearity of reference clock signals is significantly reduced compared to the conventional technique. Accordingly, when multi-phase clock signals are generated using the multi-phase generating apparatus according to an exemplary embodiment of the present invention, phase offsets are reduced by about 25%, compared to the conventional technique.

Because an exemplary embodiment of the present invention having the above-described construction can generate a plurality of reference clock signals having equal phase delay intervals between each other, regardless of the frequency of an external clock signal received from the outside, it is possible to generate multi-phase clock signals whose phase offsets are significantly reduced compared to the conventional technique. Accordingly, it is possible to improve the writing and reading performance of systems requiring multi-phase clock signals.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of generating N multi-phase clock signals having different phases from an external clock signal received from the outside, the method comprising:
    generating L reference clock signal groups having predetermined phase delay intervals from the external clock signal, wherein each reference clock signal group includes M sub reference clock signals, each sub reference clock signal in a reference clock signal group having a same target delay phase;
    averaging phases of sub reference clock signals for each reference clock signal group, and generating L main reference clock signals from the L×M sub reference clock signals such that each L main reference clock signal is a single main reference clock signal corresponding to an average of the phases of the sub reference clock signals from the same reference clock signal group; and
    sequentially delaying the L main reference clock signals, and generating N multi-phase clock signals having different phases.

2. The method of claim 1, wherein in the step of generating L main reference clock signals, the phases of sub reference clock signals for each reference clock signal group are averaged over at least two stages.

3. The method of claim 1, wherein in the step of generating L main reference clock signals, the phases of sub reference clock signals for each reference clock signal group are averaged through interpolation.

4. The method of claim 1, wherein L is selected as one of 4, 5, and 6.

5. The method of claim 1, wherein M is selected to be equal to or greater than 3.

6. A multi-phase clock signal generating apparatus for generating N clock signals having different phases from an external clock signal received from the outside, the apparatus comprising:
    a sub reference clock generator generating L reference clock signal groups having predetermined phase delay intervals from the external clock signal, wherein each reference clock signal group includes M sub reference clock signals, each sub reference clock signal in a reference clock signal group having a same target delay phase;
    a main reference clock generator averaging phases of the sub reference clock signals for each reference clock signal group, and generating L main reference clock signals from the L×M sub reference clock signals such that each L main reference clock signal is a single main reference clock signal corresponding to an average of the phases of the sub reference clock signals from the same reference clock signal group; and a delay cell matrix sequentially delaying the L main reference clock signals, and generating N multi-phase clock signals having different phases.

7. The apparatus of claim 6, wherein the main reference clock generator comprises at least two stages averaging the phases of the sub reference clock signals for each reference clock signal group.

8. The apparatus of claim 7, wherein each stage comprises a plurality of averaging units, each averaging unit receiving at least two reference clock signals from the previous stage and generating one of the L main reference clock signals.

9. The apparatus of claim 8, wherein a final stage of the main reference clock generator comprises L averaging units.

10. The apparatus of claim 6, wherein the delay cell matrix comprises N sub delay cells generating the N multi-phase clock signals having different phases.

11. The apparatus of claim 6, wherein the delay cell matrix comprises L channels receiving the main reference clock signals.

12. The apparatus of claim 6, wherein L is one of 4, 5, and 6.

13. The apparatus of claim 6, wherein M is equal to or greater than 3.

* * * * *